US006733683B2

(12) United States Patent
Dewa

(10) Patent No.: US 6,733,683 B2
(45) Date of Patent: May 11, 2004

(54) METHOD OF FABRICATING A COOPERATING ARRAY OF ROTATABLE MICROSTRUCTURE DEVICES

(75) Inventor: Andrew S. Dewa, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 60 days.

(21) Appl. No.: 09/942,014

(22) Filed: Aug. 29, 2001

(65) Prior Publication Data

US 2002/0074310 A1 Jun. 20, 2002

Related U.S. Application Data

(60) Provisional application No. 60/256,424, filed on Dec. 18, 2000.

(51) Int. Cl.[7] .................................................. B44C 1/22
(52) U.S. Cl. .............................. 216/22; 216/24; 438/29; 438/33
(58) Field of Search ........................ 216/22, 24; 438/29, 438/33, 31; 315/6, 15, 16

(56) References Cited

U.S. PATENT DOCUMENTS 6,379,510 B1 * 4/2002 Kane et al. ............ 204/192.34
6,430,332 B1 * 8/2002 Laor et al. .................... 385/18
6,445,844 B1 * 9/2002 Neukermans et al. ......... 385/18

* cited by examiner

Primary Examiner—Lan Vinh
(74) Attorney, Agent, or Firm—William B. Kempler; W. James Brady, III; Frederick J. Telecky, Jr.

(57) ABSTRACT

A method of manufacturing an array of microstructures, such as a micromirror array assembly (10, 20) for use in optical modules (5, 17) in a wireless network system, is disclosed. The micromirror array assembly (10, 20) includes a plurality of mirrors (29) monolithically formed from a silicon wafer (70) with a frame (43), attached by way of hinges (55) and gimbal portions (45). The wafer is temporarily bonded to a support wafer (60) while permanent magnets (53) are attached to each of the gimbal portions (45) associated with the mirrors (29), through holes etched through the mounting wafer (60). The resulting frame (43) is then mounted to a coil driver assembly (50) so that coil drivers (34) can control the rotation of each mirror (29), under separate control from control circuitry (14, 24). The micromirror array assembly (10, 20) is able to support higher signal energy at larger spot sizes, and also enables multiplexed transmission and receipt, as well as sampling of the received beam for quality sensing. Yield loss is avoided in the manufacture of the micromirror array assembly (10, 20) through the bonding of the mirror wafer (60) to the support wafer (70) while the magnets (53) are being attached.

18 Claims, 6 Drawing Sheets

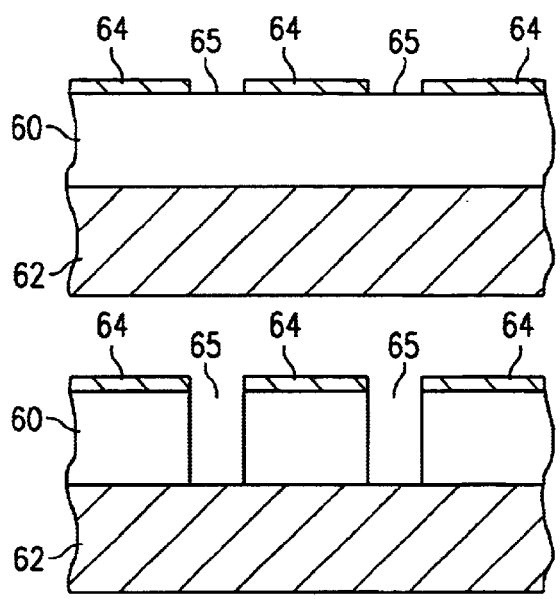
FIG. 4c
FIG. 4d
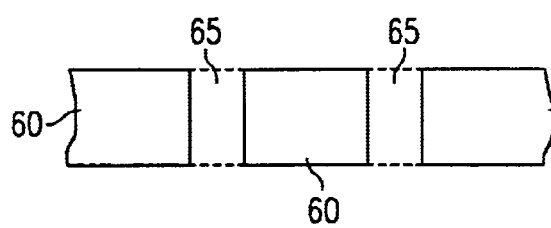
FIG. 4e
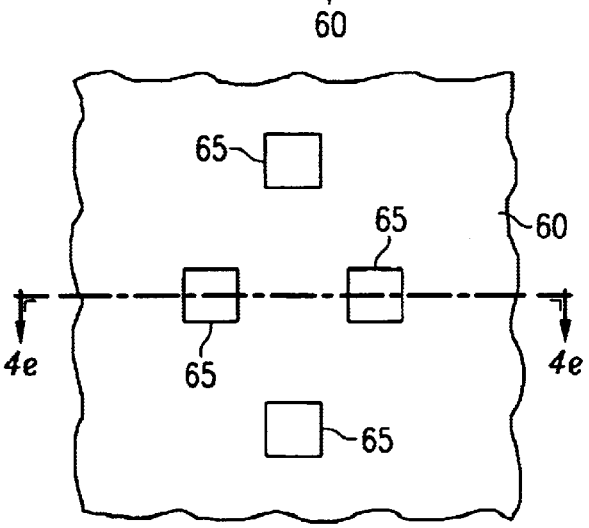
FIG. 4f
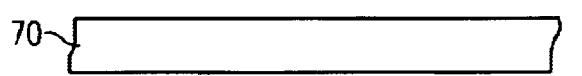
FIG. 5a
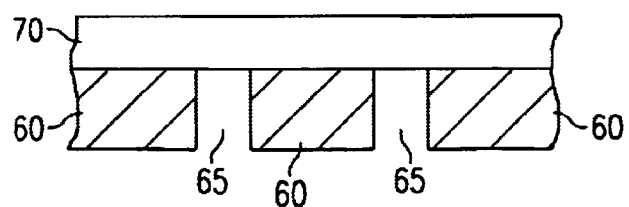
FIG. 5b

METHOD OF FABRICATING A COOPERATING ARRAY OF ROTATABLE MICROSTRUCTURE DEVICES

CROSS-REFERENCE TO RELATED APPLICATIONS

This application claims priority under 35 USC 517 119 (e) (1) of Provisional Application No. 60/256,424, filed Dec. 18, 2000.

STATEMENT REGARDING FEDERALLY SPONSORED RESEARCH OR DEVELOPMENT

Not applicable.

BACKGROUND OF THE INVENTION

This invention is in the field of microstructure manufacture, and is more specifically directed to the manufacture of rotatable microstructures, such as micromirror assemblies for optical wireless communications.

In recent years, techniques have been developed for the fabrication of movable microstructures, resulting in the capability of micromachines. These techniques generally involve the selective etching of a monolithic body, for example a silicon wafer. The manufacturing processes are similar to those used in the fabrication of integrated circuits, including photolithography to define the locations at which the wafers are to be etched to define the microstructure. The silicon material may be etched to produce features that are sufficiently fine to permit repeated flexure, and thus serve as hinges. Positioning of the hinged microstructure may be magnetically controlled.

One application of such positionable microstructures is in an optical wireless communications network. According to this approach, data is transmitted by way of modulation of a light beam, in much the same manner as in the case of fiber optic telephone communications. A photoreceiver receives the modulated light, and demodulates the signal to retrieve the data. The aiming of the light beam may be carried out by way of a positionable micromirror such as described in copending application Ser. No. 09/310,284, filed May 12, 1999, entitled "Optical Switching Apparatus", commonly assigned herewith and incorporated herein by this reference. As disclosed in this application, the micromirror reflects the light beam in a manner that may be precisely controlled by electrical signals. As disclosed in this patent application, the micromirror assembly includes a silicon mirror capable of rotating in two axes. One or more small magnets are attached to the micromirror itself; a set of four coil drivers are arranged in quadrants, and are current-controlled to attract or repel the micromirror magnets as desired, to tilt the micromirror in the desired direction. These single micromirror assemblies in the optical transmitter modules provide good communications in many applications.

However, practical and regulatory limits on the power density of the transmitted beam in turn limit the signal energy that may be communicated using these single beam steering elements. For example, an important power density limit is that defining the "eye-safe" power density of the transmitted beams; use of a power density above this limit requires significant facility modifications (e.g., warning lights, eye protection, etc.), which are inconsistent with use of the system for data communications in office and building-to-building environments. Reduction of the power density of the transmitted beam by increasing the beam cross-sectional diameter requires a corresponding increase in the size of the micromirror beam steering element. As known in the telescope art, however, the construction of accurate mirrors with larger diameters is an increasingly difficult task. As such, according to conventional technology, it becomes very costly to increase the signal power of an optical communications beam while maintaining the power density below safety and other limits.

In the manufacture of micromirror assemblies, as in the manufacture of any microstructures, mechanical damage of the microstructure is a primary cause of yield loss, and thus directly affects the manufacturing cost of the microstructures. In the case of rotatable micromirrors, for example, mechanical damage especially occurs during attachment of the permanent magnets. In particular, it has been observed that the integrated torsional hinges are frequently damaged during the placement of the individual micromirror elements into chip trays or other fixtures in which the permanent magnets are attached according to conventional methods. Indeed, it has been observed that a drop of a micromirror from a height of only 1 to 2 mm is enough to break a hinge. Equivalent manufacturing operations for other classes of microstructures, where actuating devices are attached to the structures, are also prone to damage the fragile microstructures and cause yield loss.

BRIEF SUMMARY OF THE INVENTION

It is an object of the present invention to provide a method of manufacturing microstructures in such a way that the structures are less vulnerable to mechanical damage.

It is a further object of the present invention to provide a method of mounting permanent control magnets to an array of micromirrors while yet in wafer form.

It is a further object of the present invention to provide such a method of mounting with improved manufacturing yield.

It is therefore an object of the present invention to provide such a method that may be applied to the fabrication of a mirror assembly that can accurately steer a relatively large optical beam in the communication of optical data.

These and other objects and advantages of the present invention will be apparent to those of ordinary skill in the art having reference to the following specification together with its drawings.

According to the present invention, an array of rotatable microstructures may be assembled and mounted in combination with its permanent magnets, in wafer form. A carrier wafer is first prepared, with holes etched therethrough to receive the eventual bottomside permanent magnets. The wafer from which the structures are to be formed is then attached to the carrier wafer, and the structures are formed into this wafer. For the example of micromirrors, the mirrors, hinges, and gimbals are formed into this wafer. Magnets are then attached to the bottomside of the structures at the location of the etched holes in the carrier wafer; opposing topside magnets may also be attached to the structure wafer. The structure wafer may then be released from the carrier wafer, to yield the array of microstructures with attached magnets.

BRIEF DESCRIPTION OF THE SEVERAL VIEWS OF THE DRAWING

FIGS. 4a through 4e are cross-sectional views, and FIG. 4f is a corresponding plan view, illustrating the fabrication of a carrier wafer according to a preferred embodiment of the invention.

FIGS. 5a through 5e are cross-sectional views illustrating the fabrication of a mirror wafer in conjunction with the carrier wafer according to the preferred embodiment of the invention.

DETAILED DESCRIPTION OF THE INVENTION

The present invention will be described in connection with its preferred embodiments, with an example of an application of these preferred embodiments in a communications network. It is contemplated, however, that the present invention may be realized not only in the manner described below, but also by way of various alternatives which will be apparent to those skilled in the art having reference to this specification. It is further contemplated that the present invention may be advantageously implemented and used in connection with a variety of applications besides those described below. It is therefore to be understood that the following description is presented by way of example only, and that this description is not to be construed to limit the true scope of the present invention as hereinafter claimed.

In particular, the present invention, directed to a method of manufacturing microstructures, will be described primarily relative to the fabrication of an array of micromirrors as used in connection with an optical wireless network. It is contemplated that this method may be used, and its benefits attained, in connection with other types of microstructures, as will be apparent to those skilled in the art having reference to this specification. Such other uses are contemplated to be within the scope of the invention as claimed.

Figure 1:
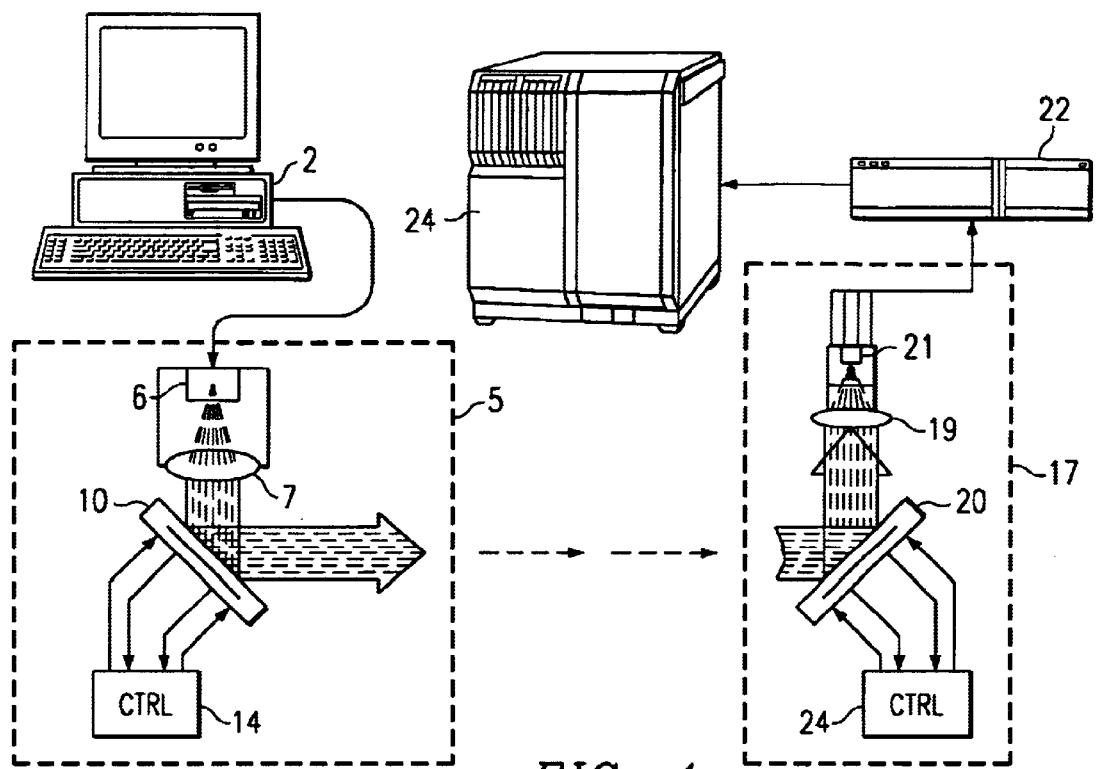
FIG. 1 is a schematic drawing of an optical wireless network using a micromirror assembly, according to the preferred embodiment of the invention, in both the transmission and receive legs.

Referring first to FIG. 1, an example of an optical wireless network will be illustrated, to provide context for the present invention. In this simple example, unidirectional communications are to be carried out from computer 2 to server 20, by way of modulated directed light. In this example, computer 2 is a conventional microprocessor based personal computer or workstation, including the appropriate network interface adapter for outputting the data to be communicated. Computer 2 is connected to transmitter optical module 5, which both aims a directed light beam at the desired receiver optical module 17, and modulates the light beam to communicate the data.

Alternatively, the transmitting source may be a network switch or router, a source of video data such as a DVD player or a television set-top converter box, or the like, rather than computer 2 as shown. It is contemplated that the present invention may be used in connection with effectively any source of digital data.

In this example, transmitter optical module 5 includes modulating laser 6, which generates a collimated coherent light beam of the desired wavelength (e.g., 850 nm) and power. Modulating laser 6 modulates this light beam according to the digital data being transmitted. The modulation scheme used preferably follows a conventional data communications standard, such as those used in connection with fiber optic network data communications. Lens 7, according to this preferred embodiment of the invention, spreads the laser beam produced by laser 6 into a relatively large spot size, so that the resulting output power density is below the appropriate safety limit (e.g., on the order of 500 $\mu$W/cm$^2$ or less, measured at the transmitter exit). The spot size of the laser beam exiting lens 7 can be as large as desired, for example up to on the order of several centimeters in diameter.

This spread beam is reflected from micromirror array assembly 10 toward receiver optical module 17. The construction of micromirror array assembly 10 according to the preferred embodiments of the invention will be described in further detail below. For purposes of this general description of FIG. 1, control circuitry 14 is provided to direct the orientation of micromirror array assembly 10, and the individual micromirrors in assembly 10, to achieve the particular operation and performance desired. This control and operation of micromirror array assembly 10 will be described in further detail below.

On the receiver end, receiver optical module 17 captures the incoming directed light beam, and converts the modulated light energy to an electrical signal. In this example, receiver optical module 17 includes its own micromirror array assembly 20, which is similarly constructed as micromirror array assembly 10 in transmitter optical module 5, as will be described below. Micromirror array assembly 20 is controlled by control circuitry 24 to steer, direct, and optionally focus the incoming optical beam to lens 19, which in turn further focuses the optical beam to photodiode 21. Photodiode 21 and its accompanying circuitry (such as demodulators, filters, and the like, not shown) modulates an electrical signal in response to the intensity of incoming light. The demodulated communicated electrical signal is then forwarded from receiver optical module 17 to router 22, and thus into the receiving network, for eventual distribution to server 24, in this example.

As evident from FIG. 1 and the foregoing description, this example illustrates a unidirectional, or simplex, communications approach, for ease of this description. It will be appreciated by those skilled in the art that bi-directional, or duplex, communications may be carried out by providing another transmitter-receiver pair for communicating signals in the opposite direction (router 22 to computer 2). Additionally, this example illustrates the use of micromirror array assemblies 10, 20 at both the transmit and receive ends of the network; it is of course contemplated that the present invention may alternatively be embodied into a system where the micromirror array assembly is implemented at only one end of the communication, with conventional optical devices (e.g., a single or no micromirror) deployed at the other end.

The communications arrangement of FIG. 1 may be utilized in connection with a wide range of applications, beyond the simple computer-to-network example suggested by FIG. 1. For example, it is contemplated that each of multiple computers in an office or other workspace may communicate with one another and with a larger network by way of modulated light to a central receiver within the room, and also between rooms by way of relayed communications along hallways or in a space frame. These applications include both point-to-point communications, and also communications between a point location (e.g., a workstation) and a multipoint location (e.g., a network hub). Other indoor applications for this optical wireless communications may include the communication of video signals from a computer or DVD player to a large-screen projector. It is further contemplated that optical wireless communications in this fashion may be carried out in this manner but on a larger scale, for example between or among buildings, and between an outdoor point location such as a building, and a multipoint location such as transceivers deployed on a tower.

The aim of micromirror array assemblies 10, 20 must be precisely controlled to successfully direct the modulated laser beam to receiver optical module 17 and lens 19, respectively, and thus optimize the signal-to-noise ratio of the transmitted signals. It is contemplated that this precision positioning is preferably accomplished by way of calibration and feedback, so that the mirror is able to sense its position and make corrections. Control circuitry 14, 24 are provided to control the operation of micromirror array assemblies 10, 20, respectively, in response to control and feedback signals, as will also be described in further detail below.

Figure 2A:
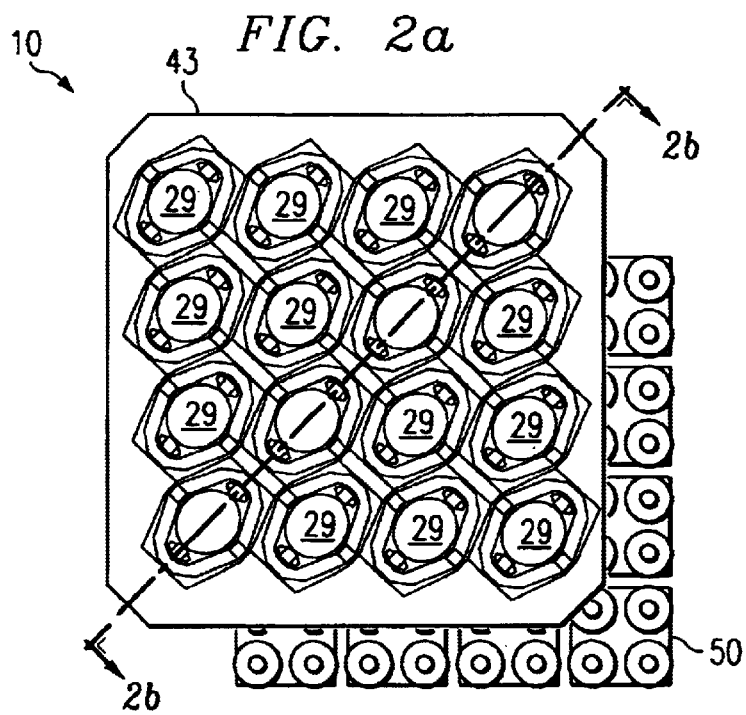
FIG. 2a is an exploded view of a micromirror array assembly according to the preferred embodiments of the invention.
Figure 2B:
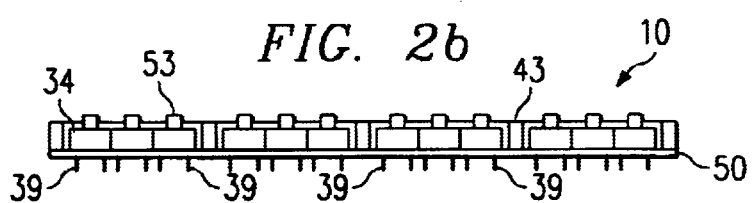
FIG. 2b is a cross-sectional view of the micromirror array assembly of FIG. 2a, according to the preferred embodiments of the invention.
Figure 2C:
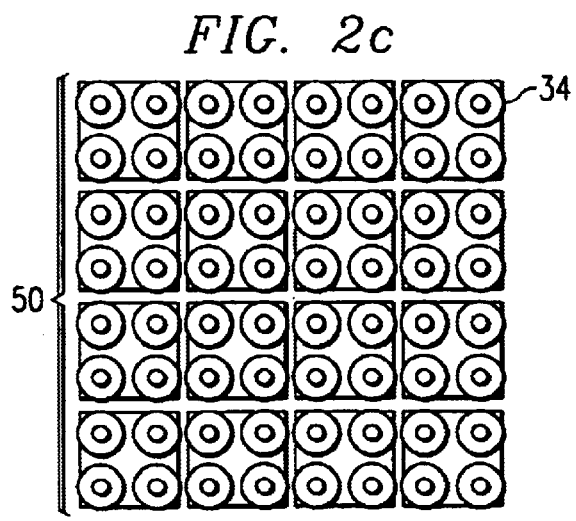
FIG. 2c is a plan view of the coil driver array of the micromirror assembly of FIG. 2a, according to the preferred embodiments of the invention.

Referring now to FIGS. 2a through 2c, the construction of micromirror array assembly 10 according to the preferred embodiment of the invention will now be described in detail. Micromirror array assembly 20 in receiver optical module 17 is contemplated to be similarly constructed as micromirror array assembly 10, and as such its construction will not be separately described.

As shown in the exploded view of FIG. 2a, micromirror array assembly 10 includes frame 43 of mirrors 29. In this example, mirrors 29 are arranged in a four-by-four closely-packed arrangement; it will be understood, of course, that the particular array size and arrangement of frame 43 may vary from that shown, without departing from the present invention. For example, it is contemplated that up to on the order of one hundred mirrors 29 may be deployed in a single array.

Each mirror 29 is monolithically integrated with and attached to frame 43, all formed of a single silicon element, as will be described below. Four permanent magnets 53 are attached to frame 43 in association with each mirror 29. In this example of micromirror array assembly 10, each permanent magnet 53 is mounted to overlie a corresponding coil driver 34 of coil driver array 50, as shown in the cross-sectional view of FIG. 2b. As illustrated in the plan view of FIG. 2c, one coil driver 34 is associated with each permanent magnet 53, and coil drivers 34 are arranged in groups of four to correspond to the four permanent magnets 53 of a mirror 29. Electrical connection to each coil driver 34 is provided by one or more leads 39, so that each coil driver 34, and thus each mirror 29, may be individually controlled, separately from the other micromirror surfaces 29 if so desired. Such control will be described in further detail below.

Alternatively, other arrangements of permanent magnets 53 may be deployed. For example, it is contemplated that a single permanent magnet 53 may be attached to the underside of mirror 29; the four coil drivers 34 associated with the mirror 29 would, in this case, be controlled to deflect the single magnet 53 and thus rotate mirror 29 about the two axes. This implementation, as well as other alternative realizations, will be apparent to those skilled in the art having reference to this specification.

FIGS. 3 and 3a through 3d illustrate an individual mirror element 41 of micromirror array assembly 10 in further detail. Mirror element 41 includes an intermediate gimbals portion, and an inner mirror portion, all preferably formed from one piece of crystal material, such as silicon, along with frame 43. In its fabrication, silicon is etched to provide frame 43, forming an opening in which intermediate annular gimbals portion 45 is attached at opposing hinge locations 55 along first axis 31. Inner, centrally disposed mirror body 47, a surface of which serves as mirror 29, remains attached to gimbals portion 45 at hinge portions 55 on a second axis 35, 90 degrees from the first axis. Mirror body 47, which is on the order of 100 microns in thickness, is suitably polished on its upper surface to provide the specular surface of mirror 29. Preferably, this polished surface is plated with a metal, such as aluminum or gold, to provide further reflectivity. In order to provide necessary flatness, each mirror 29 is formed with a radius of curvature greater than approximately 2 meters, with increasing optical path lengths requiring increasing radius of curvature. The radius of curvature can be controlled by known stress control techniques, by polishing, and by deposition techniques for stress controlled thin films. If desired, one or more coatings of suitable material can be placed on the mirror portion to enhance its reflectivity for specific radiation wavelengths.

Individual mirror element 41 includes a first pair of permanent magnets 53 mounted on gimbals portion 45 along the second axis, and a second pair of permanent magnets 53 mounted on extensions 51, which extend outwardly from mirror body 47 along the first axis. In order to symmetrically distribute mass about the two axes of rotation to thereby minimize oscillation under shock and vibration, each permanent magnet 53 preferably comprises a set of an upper magnet 53a mounted on the top surface of the mirror element 41 using conventional attachment techniques such as indium bonding, and an aligned lower magnet 53b similarly attached to the lower surface of the mirror assembly as shown in FIGS. 3a through 3d. The magnets of each set are arranged serially such as the north/south pole arrangement indicated in FIG. 3c. There are several possible arrangements of the four sets of magnets which may be used, such as all like poles up, or two sets of like poles up, two sets of like poles down; or three sets of like poles up, one set of like pole down, depending upon the magnetic characteristics desired for the expected arrangement of coil drivers 34.

The mounting of gimbals portion 45 to frame portion 43 by means of hinges 55 provides motion of the gimbals portion 45 about the first axis 31, and the mounting of mirror body 47 to gimbals portion 45 via hinges 55 provides motion of the mirror portion relative to the gimbals portion about the second axis 35. Mirror element 41 according to the preferred embodiment of the invention may therefore be controlled to independently rotate mirror 29 about two orthogonal axes.

Figure 3:
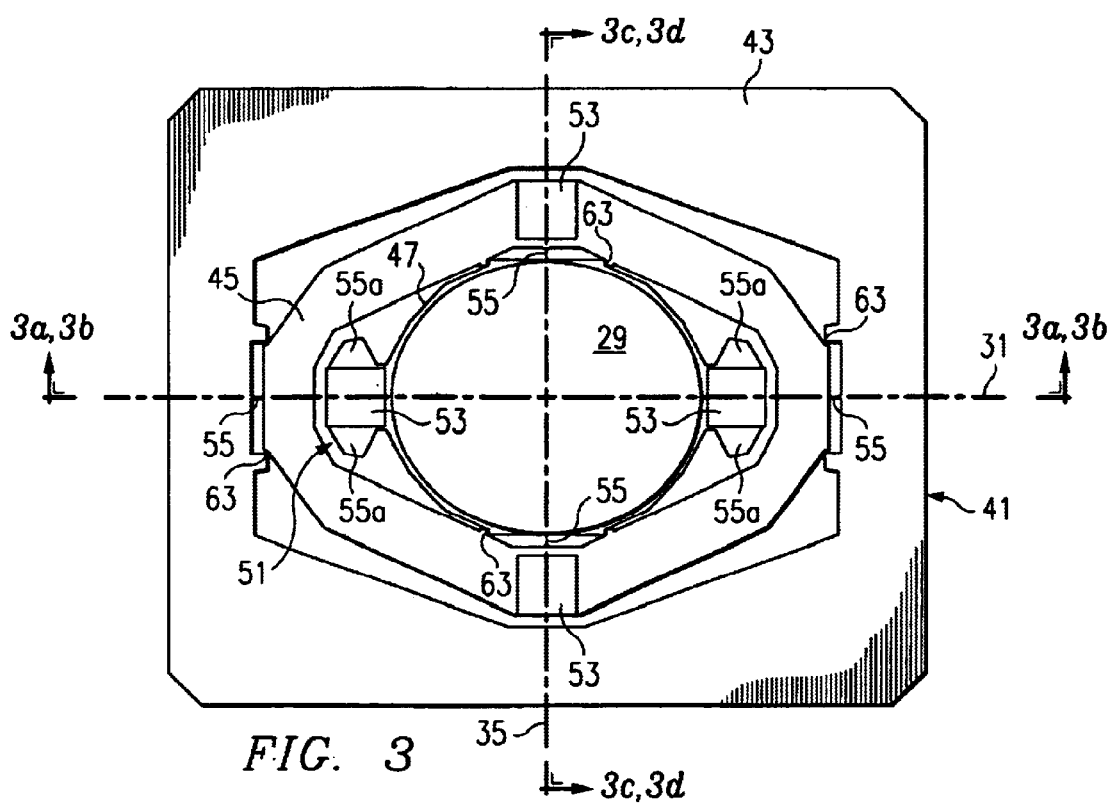
FIG. 3 is a plan view of a mirror element in the micromirror array assembly according to the preferred embodiments of the invention.
Figure 3A:
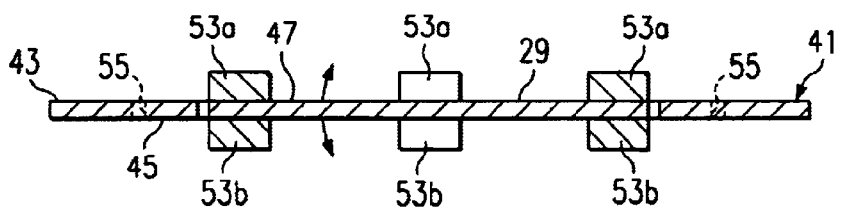
FIGS. 3a through 3d are cross-sectional views of the mirror element of FIG. 3, illustrating its operation.
Figure 3B:
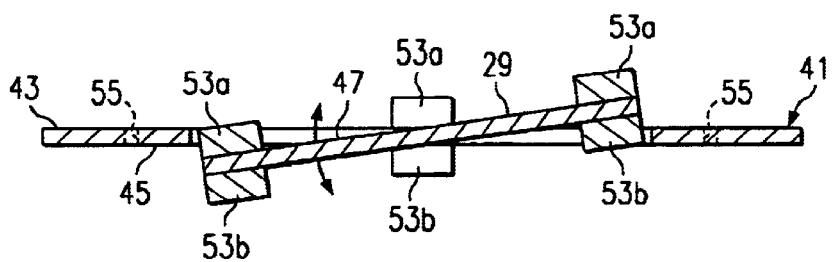
Figure 3C:
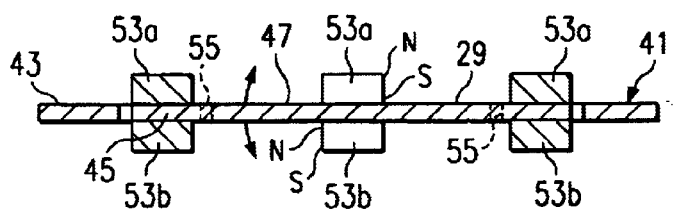
Figure 3D:
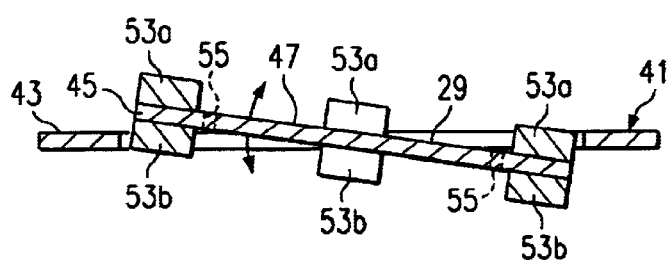

The middle or neutral position of mirror element 41 is shown in FIG. 3a, which is a section taken through the assembly along line A—A of FIG. 3. Rotation of mirror body 47 about axis 35 independent of gimbals portion 45 and/or frame portion 43 is shown in FIG. 3b as indicated by the arrow. FIG. 3c shows the middle position of the mirror element 41, similar to that shown in FIG. 3a, but taken along line B—B of FIG. 3. Rotation off the gimbals portion 45 and mirror body 47 about axis 31 independent of frame portion 43 is shown in FIG. 3d as indicated by the arrow. The above independent rotation of mirror 29 of mirror body 47 about the two axes allows direction of the modulated optical beam as needed by the optical switch units.

In order to protect hinges 55 from in-plane shock during handling and shipping, stops 57 may be provided, as described in the above-incorporated application Ser. No. 09/310,284. According to another optional feature of the invention, lock down tabs associated with each hinge 55 are provided, also as described in the above-incorporated application Ser. No. 09/310,284.

As shown in FIG. 3, extensions 51 are preferably provided with laterally extending tabs 51a, which can be used to clamp down the mirror portion during assembly to provide additional stress protection.

A method of fabricating frame 43 with an array of mirrors 29 as described above, and the mounting of permanent magnets 53 to frame 43, according to the preferred embodiment of the invention will now be described in detail. This embodiment of the invention takes advantage of the arrangement of mirrors 29 in an array, and their simultaneous fabrication in wafer form, to also mount permanent magnets 53 at the wafer level. It has been observed, in connection with the present invention, that a primary cause of yield loss in the manufacture of micromirror assemblies is the mechanical damage of the micromirrors during attachment of the permanent magnets. In particular, it has been observed that the integrated torsional hinges are frequently damaged during the placement of the individual micromirror elements into chip trays or other fixtures in which the permanent magnets are attached according to conventional methods. Indeed, it has been observed that a drop of a micromirror from a height of only 1 to 2 mm is enough to break a hinge. According to the present invention, as will now be described, mounting of the permanent magnets may be accomplished at the wafer level, greatly reducing the likelihood of damage to the integrated torsional hinges.

While this embodiment of the invention will be described in connection with the fabrication of a micromirror array assembly, it will be understood by those skilled in the art having reference to this specification that this method of fabrication may be used to advantage in fabricating other micromirror assemblies, including individual micromirrors, for example by dicing the micromirrors from the wafer after attachment of their corresponding permanent magnets. Further, the process according to this embodiment of the invention is generally applicable to the formation of microstructures other than micromirrors.

In general, according to this preferred embodiment of the invention, a carrier wafer is fabricated for use in combination with a mirror layer from which the micromirrors are formed. This carrier wafer defines the locations at which the permanent magnets are attached to the mirror wafer, and also supports the mirror wafer during the attachment of the permanent magnets at these locations.

Figure 4A:
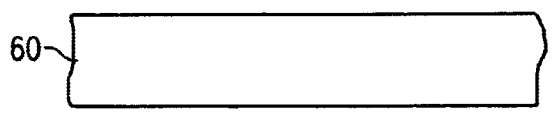
Figure 4B:
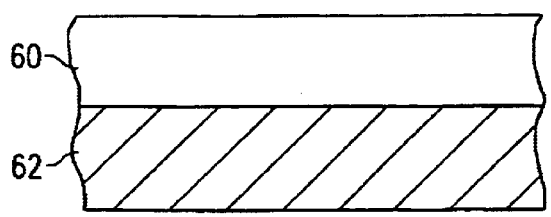

Referring now to FIGS. 4a through 4f, the fabrication of carrier wafer 60 according to this preferred embodiment of the invention will now be described. FIG. 4a illustrates a cross-section of an operative portion of carrier wafer 60 in its initial starting state. For example, carrier wafer 60 may be a $375\mu$ thick silicon wafer, polished on both sides; in this example, conventional semiconductor process techniques may be used to define the various features to be formed in silicon carrier wafer 60. As shown in FIG. 4b, carrier wafer 60 is then bonded to its own support wafer 62, which may be a silicon wafer of significant thickness, such as 15 mils, but which need not be polished on either side; support wafer 62 is simply used to support carrier wafer 60 during its processing, as will be described below. The bonding between carrier wafer 60 and support wafer 62 is preferably by way of a temporary releasable bonding agent, such as positive photoresist or wafergrip.

Permanent magnet locations 65 are then defined at the exposed surface of carrier wafer 60, by way of conventional photolithography. As shown in FIG. 4c, hard mask layer 64 is formed over this exposed surface of carrier wafer 60, and removed by way of photolithography to define openings at permanent magnet locations 65. A preferred material for hard mask layer 64 is silicon dioxide, preferably patterned using conventional photoresist-based photolithography techniques. Carrier wafer 60 is then subjected to an etch, preferably a reactive ion etch such as the conventional Bosch etch process, to etch permanent magnet locations 65 completely through carrier layer 60, as shown in FIG. 4d. This etch may be stopped once support wafer 62 is reached, although the precision of the stopping of the etch is not critical, as support wafer 62 is disposable and therefore may be itself etched to ensure clearing of locations 65 in carrier wafer 60. Support wafer 62 is then removed, to release carrier wafer 60. As a result of this etch, carrier wafer 60 is provided with openings completely through its thickness at permanent magnet locations 65, as illustrated in FIGS. 4e and 4f.

Figure 5C:
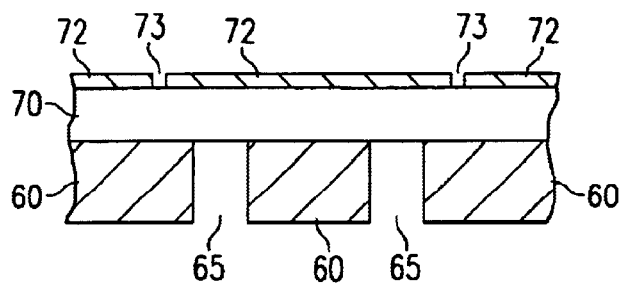
Figure 5D:
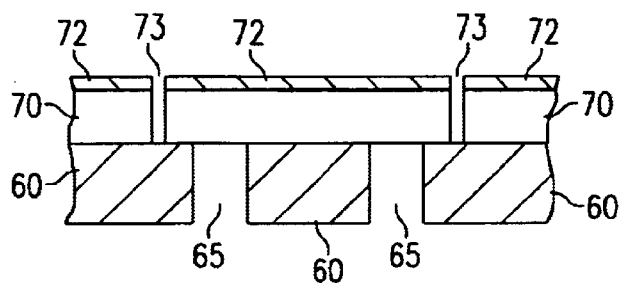
Figure 5E:
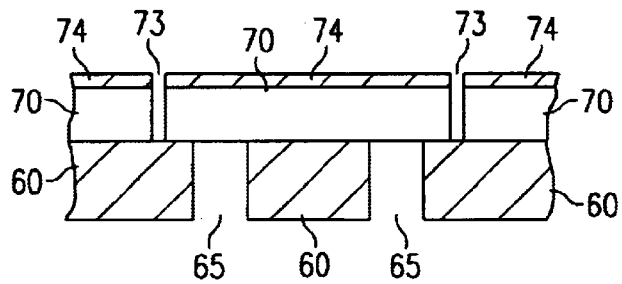

Referring now to FIGS. 5a through 5e, the fabrication of mirror wafer 70 according to the preferred embodiment of the invention, using carrier wafer 60 fabricated as described above, will now be described. In this exemplary embodiment, mirror wafer 70, a portion of which is shown in cross-section in FIG. 5a, is a double-side polished silicon wafer having the desired thickness for use in micromirror array assembly 10, for example on the order of $115\mu$ thick. Mirror wafer 70 is bonded to carrier wafer 60 by way of a temporary releasable bonding agent, such as positive photoresist or wafergrip, providing the structure illustrated in FIG. 5b.

The features of frame 43 and mirrors 29, along with their associated gimbals 45 and hinges 55, are then formed in mirror wafer 70. According to this embodiment of the invention, mask layer 72 is formed at the exposed surface of mirror wafer 70. Mask layer 72 may be a hard mask formed of a durable material such as silicon dioxide, or alternatively may be photoresist. Hard mask layer 72 is then photolithographically patterned in the conventional manner for semiconductor integrated circuit manufacture, defining openings 73 corresponding to the locations separating the various features (frame 43, mirrors 29, gimbals 45, hinges 55, etc.). The locations of openings 73 are selected with registration to permanent magnet locations 65. Given the construction of frame 43 and its features, described above relative to FIG. 3, it is contemplated that none of openings 73 will overlie permanent magnet locations 65; rather, mirror wafer 70 is aligned with carrier wafer 60 so that permanent magnet locations 65 of carrier wafer 60 are aligned with corresponding expected locations of permanent magnets 53. The patterning of hard mask layer 72 is illustrated in FIG. 5c.

Once hard mask layer 72 is patterned, mirror wafer 70 is then etched to form openings 73 and thus define the desired features of frame 43. A preferred example of the etch used to form openings 73 is a reactive ion etch, for example according to the well-known Bosch process. Openings 73 are etched completely through the entire thickness of mirror wafer 70, resulting in the structure shown in FIG. 5d. Hard mask layer 72 is then removed from the surface of mirror wafer 70. According to this preferred embodiment of the invention, the surface of mirror wafer 70 is then plated with reflective material 74, for example gold, to provide the structure illustrated in FIG. 5e. At this stage in the process, mirror wafer 70 has its features defined to provide an array of micromirror elements 41, as shown in the plan views of FIGS. 2a and 3, and remains bonded to carrier wafer 60 as shown in the cross-sectional view of FIG. 5e.

Figure 6A:
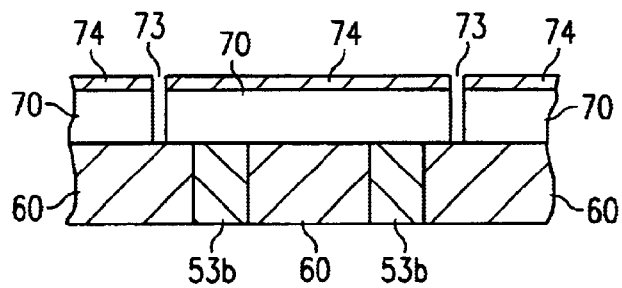
FIGS. 6a through 6c are cross-sectional views illustrating the mounting of permanent magnets to the mirror wafer using the carrier wafer, according to the preferred embodiment of the invention.
Figure 6B:
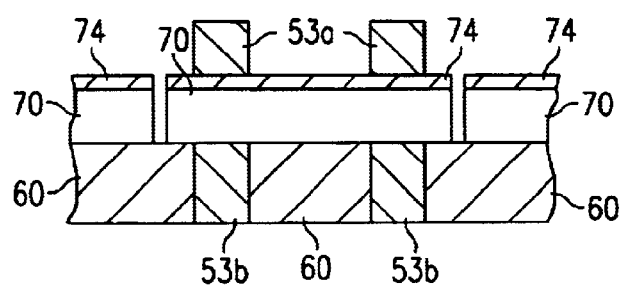
Figure 6C:
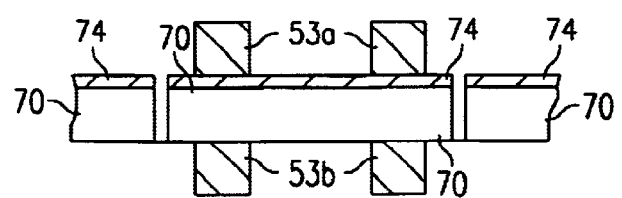

Referring now to FIGS. 6a through 6c, the mounting of permanent magnets 53 to mirror wafer 70, according to the preferred embodiment of the invention, will now be described. With carrier wafer 60 in place, as shown in FIG. 6a, lower permanent magnets 53b are bonded to mirror wafer 70, at the locations defined by openings 65 in carrier wafer 60. This bonding of magnets 53b is preferably a permanent bonding, for example by way of an epoxy. It is contemplated that the size of openings 65 may be formed with sufficient precision to precisely locate lower permanent magnets 53b at the appropriate locations of mirror wafer 70. As shown in FIG. 6b, with carrier layer 60 still in place, upper permanent magnets 53a are then bonded to mirror wafer 70, at locations opposing those of lower permanent magnets 53b. Carrier wafer 60 serves to prevent mechanical damage to mirror elements 41 in frame 43 during this mounting of upper permanent magnets 53a to mirror wafer 70. Magnets 53 can be poled either before or after attachment to mirror wafer 70.

Carrier wafer 60 may then be removed, once permanent magnets 53a, 53b are mounted, as illustrated in FIG. 6c. This releases mirror wafer 70, and mirror elements 41 and frame 43, for mounting to coil driver array 50 in the manner shown in FIG. 2a, for the completion of micromirror array assembly 10. Alternatively, as noted above, this method of fabrication may be used to mount permanent magnets 53 to individual mirror elements 41, in which case these elements 41 may now be diced from mirror wafer 70. In either case, magnets 53 are mounted to mirror elements 41 in wafer form, greatly reducing the risk of damage to the fragile mirror elements 41 while mounting magnets 53.

Figure 7:
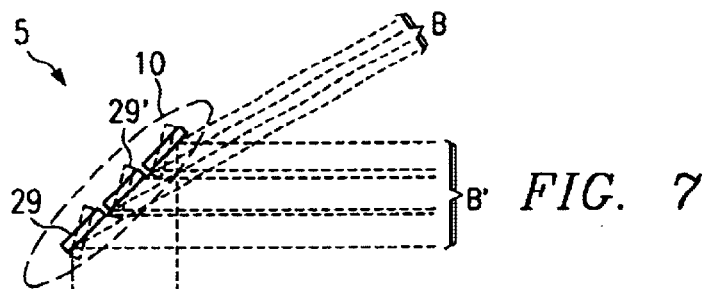
FIG. 7 is a schematic diagram illustrating the operation of a transmit optical module including a micromirror array assembly according to the preferred embodiment of the invention.

Referring now to FIG. 7, the operation of micromirror array assembly 10 in transmitter optical module 5 according to the preferred embodiment of the invention will now be described. FIG. 7 is a schematic illustration of the operable elements of transmitter optical module 5; it will be understood, of course, that other elements such as control circuitry 14 are also involved in this operation. As shown in FIG. 7, laser 6 is producing light output that is focused by lens 7 into a collimated laser beam. This light beam is directed to micromirror array assembly 10, which, according to the preferred embodiment of the invention, includes multiple mirrors 29 controlled in cooperation with one another to steer the light beam from lens 7 to the desired location. FIG. 7 illustrates the operation of mirrors 29 to steer, or direct, light beam B when controlled by control circuitry 14, via coil drivers 34 and permanent magnets 53 (not shown) into a deflected state. FIG. 7 also illustrates beam B' as directed by mirrors 29 when in a non-deflected, or null, state (shown by mirrors 29' in FIG. 7).

As illustrated by FIG. 7, therefore, micromirror array assembly 10 steers beam B, which, because of the use of multiple mirrors 29 permits a relatively large beam, in spot size, to be accurately steered with a relatively strong signal intensity, without violating regulatory or safety power density limits. The multiple smaller mirrors 29 may be produced at relatively low cost, compared to the construction and control of a larger mirror corresponding to this larger spot size. Not only is the manufacturing cost of micromirror array assembly 10 less than that of a similarly sized single mirror, but the range of the angle of deflection, and thus steerability, of the light beam is likely to be larger with micromirror array assembly 10 than with a corresponding single mirror.

Further in the alternative, micromirror array assembly 10 and transmitter optical module 5 may be implemented into a multipoint network element, such as a transmitter associated with a network hub. In such an arrangement, multiple lasers 6 and associated lenses 7 will produce multiple collimated laser beams, impinging micromirror array assembly 10 from different directions. In this implementation, control circuitry 14 will control micromirror array assembly 10 to direct the light beams to desired receivers in a time multiplexed manner; still further in the alternative, the multiple light beams may be directed to different regions of micromirror array assembly 10, with the regions being separately controlled to simultaneously reflect their associated light beams in different directions, to different receivers. It is contemplated that these and other alternative realizations of the present invention in transmitter optical modules will be apparent to those skilled in the art having reference to this specification.

Figure 8:
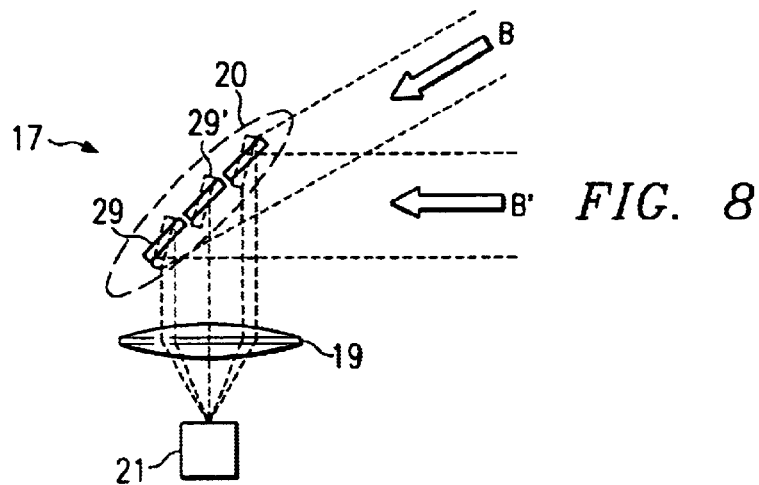
FIG. 8 is a schematic diagram illustrating the operation of a receiver optical module including a micromirror array assembly according to the preferred embodiment of the invention.

FIG. 8 schematically illustrates the operation of receiver optical module 17, including micromirror array assembly 20, operable under the control of control circuitry 24. As described above, receiver optical module 17 also includes lens 19 which focuses the received beam steered by micromirror array assembly 20 to photodiode 21. Photodiode 21 generates an electrical signal in response to the modulated light that it receives, and forwards this signal on to router 22 (FIG. 1) or other destination of the signal.

According to this preferred embodiment of the invention, micromirror array assembly 20 is controlled by control circuitry 24 (not shown in FIG. 8) to receive a modulated light beam from a selected source, and to steer this received light beam to lens 19. As shown in FIG. 8, micromirror array assembly 20 can receive incoming light over a wide angle of incidence. Beam B is steered to lens 19 by mirrors 29 when in a rotated position, as energized by the corresponding coil drivers 34 (not shown in FIG. 8); in the non-rotated position shown by mirrors 29' in FIG. 8, beam B' is directed to lens 19. As such, receiver optical module 17, including micromirror array assembly 20 constructed according to the preferred embodiment of the invention, provides a high degree of control and reception angle.

In contrast, a conventional fixed mirror would focus incoming received beams B, B' to different points at photodiode 21, necessitating a larger photodiode to receive a modulated signal beam from both directions. For high speed optical receivers, it is well known that the size of the photodiode limits the speed at which modulated light can be detected, and therefore a large photodiode limits the data transfer rate.

It is contemplated that this control of micromirror array assembly 20 by control circuitry 24 can allow for variations in the operation of receiver optical module 17. For example, modulated light beams B from multiple sources may be steered by micromirror array assembly 20 in a time-multiplexed fashion, such that signals from multiple sources may be processed, for example by router 22 of FIG. 1. Conversely, such steering may be used on the transmit side, by control of micromirror array assembly 10 in transmit optical module 5 by control circuitry 14, to transmit signals to multiple receivers in a multiplexed fashion. Further in the alternative, certain ones of mirrors 29 in micromirror array assembly 20 may be rotated to fixedly steer beam B' to photodiode 21, while others of mirrors 29 may be rotated to fixedly steer beam B to photodiode 21; in this case, downstream demodulation or demultiplexing of the light beam sensed by photodiode 21 may be used to separate the signals from the multiple sources, rather than multiplexing by beam aim control. This fixed steering of the beam into two directions may also be performed in transmit optical module 5, with some of the mirrors 29 rotated to reflect the modulated light beam in one direction, and others of the mirrors rotated to reflect the modulated light beam in a different direction, thus facilitating broadcast of a common signal via a modulated light beam to different receivers, or facilitating the transmission of multiple signals to multiple receivers.

Figure 9:
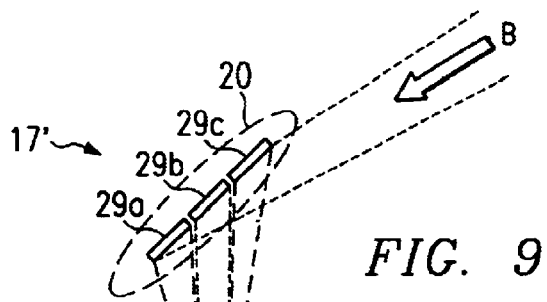
FIG. 9 is a schematic diagram illustrating an alternative mode of operation of a receiver optical module including a micromirror array assembly according to the preferred embodiment of the invention.

According to another alternative, micromirror array assembly 20 may be controlled by control circuitry 24 to fully perform or assist in the focusing of the received modulated light beam. FIG. 9 schematically illustrates this operation, in an example of receiver optical module 17' in which no focusing lens is provided. In this example, individual mirrors 29 are controlled by control circuitry 24 to have different angles of rotation from one another to focus the relatively wide beam B to the smaller photodiode 21. In the example of FIG. 9, mirror 29*b* is at the center of beam B, and in this case is at or near in its non-rotated position; mirrors 29*a*, 29*c* on opposite sides of mirror 29*b* are rotated in opposite directions, to direct the outer portions of beam B toward photodiode 21. This cooperative control of mirrors 29 focuses beam B to photodiode 21, without the necessity of a lens in receiver optical module 17'. Alternatively, micromirror array assembly 20 may be used to partially focus the beam in this manner, with a smaller lens disposed between assembly 20 and photodiode 21 to complete the focusing.

Figure 10:
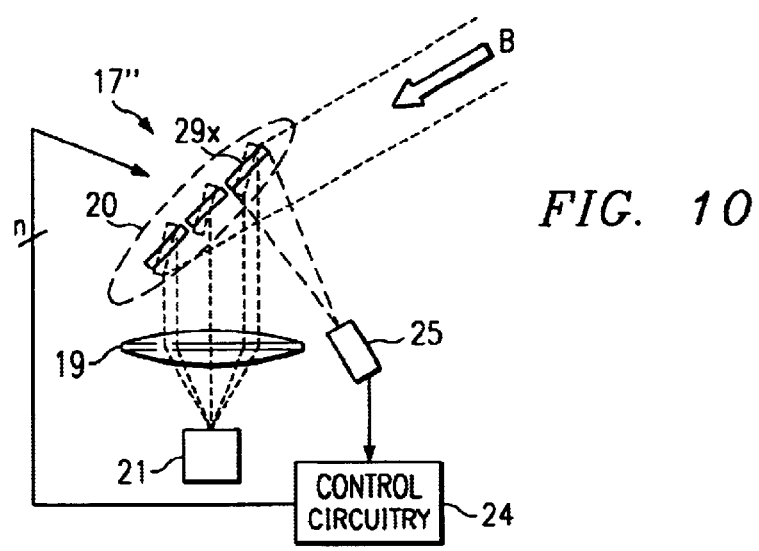
FIG. 10 is a schematic diagram illustrating another alternative mode of operation of a receiver optical module including a micromirror array assembly according to the preferred embodiment of the invention.

Referring now to FIG. 10, receiver optical module 17" according to another alternative operational arrangement is schematically illustrated. In this example, beam quality sensor 25 is provided along with photodiode 21; beam quality sensor 25 itself may also be a photodiode or other sensor for detecting the intensity of incident light. Mirror 29*x* in micromirror array assembly 21 is controlled by control circuitry 24 (not shown in FIG. 10) to periodically direct incident light to beam quality sensor 25 instead of to lens 19. Beam quality sensor 25 in turn forwards a signal corresponding to the sensed light intensity to control circuitry 24. This periodic sampling of the received light of beam B may then be used by control circuitry 24 to adjust the aim of micromirror array assembly 21 to better steer the incoming modulated light beam B to lens 19.

Further in the alternative, one or more of mirrors 29 may be periodically or constantly controlled to reflect light directly back to the source of the modulated light beam. This reflected light may be detected at the source, for example by one of mirrors 29 in micromirror array assembly 10 in similar fashion as the sampling by mirror 29*x* of FIG. 10, to adjust the aim of the transmitted modulated light beam. This feedback permits the adjustment of the transmitted beam without requiring communication over a secondary channel, as is typically now carried out in optical wireless networks.

These and other important functions are now enabled by micromirror array assemblies such as those described above. In each case, stronger optical signals may be transmitted, without violating safety or regulatory limits, at relatively low manufacturing cost due to the array of mirrors approach described in this specification. Further, additional functionality such as multiplexed operation, beam focusing, beam quality sensing, and feedback control may be readily carried out through the use of the present invention.

As will be apparent to those skilled in the art having reference to this specification, the assembly method of the present invention can be readily applied to microelectromechanical system (MEMS) structures other than micromirrors. This wide applicability of the present invention derives from the carrier wafer immobilizing, during assembly, a monolithic wafer containing a large number of fragile microstructures that are otherwise freely movable, where the carrier wafer is patterned with features that allow the aligned assembly of the microstructures while immobilized. As described above, this assembly concept is particularly useful in the manufacture of micromirrors and arrays of micromirrors. Other applications of the present invention include, without limitation, the attachment of magnets or coils to linear magnetic actuators; the attachment of magnets for planar torsional accelerometers; the attachment of magnets for many types of diaphragm or flexure actuators that move out of the wafer plane; and the assembly of three-dimensional MEMS structures.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of fabricating a plurality of microstructures comprising:

fabricating a carrier wafer having a plurality of holes therethrough;

temporarily mounting a structure wafer to the carrier wafer with alignment relative to the plurality of holes in the carrier wafer;

etching openings through the structure wafer at locations away from the plurality of holes in the carrier wafer, to form a plurality of rotatable microstructures arranged in an array attached to a frame by gimbal portions and hinges the so-formed microstructures being integral with the structure wafer;

attaching permanent magnets to the structure wafer at the locations of the holes in the carrier wafer; and then removing the carrier wafer from the structure wafer.

2. The method of claim 1, wherein the microstructures each include a reflective mirror surface.

3. The method of claim 1, wherein the step of fabricating the carrier wafer comprises:

mounting the carrier wafer to a support wafer;

forming a mask layer over a surface of the carrier wafer;

patterning the mask layer to expose the carrier wafer at selected locations;

etching through the carrier wafer at the exposed locations to form a plurality of holes; and then releasing the carrier wafer from the support wafer.

4. The method of claim 1, further comprising:

prior to the attaching step, plating a surface of the structure wafer with a reflective metal.

5. The method of claim 1, further comprising:

after the removing step, separating the microstructures from the structure wafer.

6. The method of claim 1, wherein each of the microstructures comprises a micromirror having a reflective mirror surface;

and further comprising:

after the removing step, mounting the plurality of micromirrors over a coil driver array.

7. The method of claim 1, wherein the etching step comprises:

forming a mask layer over a surface of the structure wafer;

patterning the mask layer to expose selected locations of the structure wafer;

etching through the structure wafer at the exposed locations to form the plurality of microstructures, gimbal portions, and hinges.

8. The method of claim 7, wherein the etching step comprises:

exposing the structure wafer to a wet chemical etching agent.

9. The method of claim 7, wherein the etching step comprises:

reactive ion etching the exposed locations of the structure wafer.

10. A method of fabricating a microstructure array, comprising:

fabricating a carrier wafer having a plurality of holes therethrough;

mounting a structure wafer to the carrier wafer with alignment relative to the plurality of holes in the carrier wafer;

etching openings through the structure wafer at locations away from the plurality of holes in the carrier wafer, to form a plurality of rotatable microstructures arranged in an array attached to a frame by gimbal portions and hinges;

attaching permanent magnets to the structure wafer at the locations of the holes in the carrier wafer and attaching permanent magnets at a surface of the structure wafer at locations opposite the locations of the holes in the carrier wafer;

then removing the carrier wafer from the structure wafer.

11. A method of fabricating a plurality of hinged structures, comprising:

fabricating a carrier wafer having a plurality of holes therethrough;

temporarily mounting a structure wafer to the carrier wafer with alignment relative to the plurality of holes in the carrier wafer;

etching openings through the structure wafer at locations away from the plurality of holes in the carrier wafer, to form a plurality of moveable structures monolithically formed in the structure wafer, where each of the plurality of moveable structures are integral with the carrier wafer;

attaching an actuator to the structure wafer at each location corresponding to one of the plurality of holes in the carrier wafer; and then removing the carrier wafer from the structure wafer.

12. The method of claim 11, wherein each of the moveable structures includes a reflective mirror surface.

13. The method of claim 11, wherein the step of fabricating the carrier wafer comprises:

mounting the carrier wafer to a support wafer;

forming a mask layer over a surface of the carrier wafer;

patterning the mask layer to expose the carrier wafer at selected locations;

etching through the carrier wafer at the exposed locations to form a plurality of holes; and then releasing the carrier wafer from the support wafer.

14. The method of claim 11, further comprising:

after the removing step, separating the microstructures from the structure wafer.

15. The method of claim 11, wherein the etching step comprises:

forming a mask layer over a surface of the structure wafer;

patterning the mask layer to expose selected locations of the structure wafer;

etching through the structure wafer at the exposed locations to form the plurality of moveable structures.

16. The method of claim 15, wherein the step of etching through the structure comprises:

exposing the structure wafer to a wet chemical etching agent.

17. The method of claim 15, wherein the step of etching through the structure comprises:

reactive ion etching the exposed locations of the structure wafer.

18. A method of fabricating a plurality of hinged structures, comprising:

fabricating a carrier wafer having a plurality of holes therethrough;

mounting a structure wafer to the carrier wafer with alignment relative to the plurality of holes in the carrier wafer;

etching openings through the structure wafer at locations away from the plurality of holes in the carrier wafer, to form a plurality of moveable structures monolithically formed in the structure wafer, where each of the plurality of moveable structures are immobilized by the carrier wafer;

attaching an actuator to the structure wafer at each location corresponding to one of the plurality of holes in the carrier wafer;

attaching a magnet at a surface of the structure wafer at each of a plurality of locations opposite the locations of the holes in the carrier wafer; and then removing the carrier wafer from the structure wafer.

* * * * *